(12) United States Patent
Terai

(10) Patent No.: US 10,547,027 B2
(45) Date of Patent: Jan. 28, 2020

(54) ORGANIC EL DISPLAY PANEL MANUFACTURING METHOD AND SEALING LAYER FORMING DEVICE

(71) Applicant: JOLED INC., Tokyo (JP)

(72) Inventor: Masaya Terai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/152,415

(22) Filed: Oct. 5, 2018

(65) Prior Publication Data

US 2019/0109297 A1  Apr. 11, 2019

(30) Foreign Application Priority Data

Oct. 6, 2017 (JP) .................................. 2017-196285
May 30, 2018 (JP) .................................. 2018-103849

(51) Int. Cl.
| | | |
|---|---|---|
| H01L 21/67 | (2006.01) | |
| H01L 51/52 | (2006.01) | |
| B01D 19/00 | (2006.01) | |
| B01D 69/08 | (2006.01) | |
| H01L 51/00 | (2006.01) | |
| H01L 27/32 | (2006.01) | |
| H01L 51/56 | (2006.01) | |

(52) U.S. Cl.
CPC ...... *H01L 51/5253* (2013.01); *B01D 19/0031* (2013.01); *B01D 69/08* (2013.01); *H01L 21/6715* (2013.01); *H01L 21/67126* (2013.01); *H01L 51/0005* (2013.01); *H01L 27/3244* (2013.01); *H01L 51/56* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 5,443,922 | A | 8/1995 | Nishizaki et al. |
| 2005/0061238 | A1 | 3/2005 | Sakurada |
| 2017/0239956 | A1* | 8/2017 | Karita ..................... B41J 2/175 |

FOREIGN PATENT DOCUMENTS

| | | |
|---|---|---|
| JP | H5-163488 A | 6/1993 |
| JP | 2003-282246 A | 10/2003 |
| JP | 2004-290962 A | 10/2004 |
| JP | 2006-335995 A | 12/2006 |
| JP | 2008-241882 A | 10/2008 |
| JP | 2009-120631 A | 6/2009 |
| WO | 2008/117475 A1 | 10/2008 |

* cited by examiner

*Primary Examiner* — Cheung Lee
(74) *Attorney, Agent, or Firm* — Hauptman Ham, LLP

(57) ABSTRACT

An organic EL display panel manufacturing method includes preparing a substrate. The method further includes forming a plurality of organic EL elements on the substrate. The method further includes deaerating a sealing solution with use of a filter that allows only gases to pass through, the sealing solution including an organic electrically-insulating material to which an electrically-conductive substance is added. The method further includes applying the sealing solution after the deaerating above the organic EL elements and thereby forming a sealing layer.

4 Claims, 10 Drawing Sheets

ORGANIC EL DISPLAY PANEL MANUFACTURING METHOD AND SEALING LAYER FORMING DEVICE

This application claims priority to Japanese Patent Application No. 2017-196285 filed Oct. 6, 2017 and Japanese Patent Application No. 2018-103849 filed May 30, 2018, the contents of which are hereby incorporated by reference in their entirety.

BACKGROUND

Technical Field

The present disclosure relates to an organic electroluminescence (EL) display panel manufacturing method and a sealing layer forming device for forming a sealing layer of an organic EL display panel.

Description of Related Art

Organic EL display panels include a sealing layer for protecting the entirety of a plurality of organic EL elements that are arranged two-dimensionally from deterioration caused by moisture, gas, or the like.

Conventionally, the sealing layer is formed by using silicon nitride (SiN) or the like in plasma-enhanced chemical vapor deposition (PECVD). If forming of a silicon nitride film is performed such that the silicon nitride film has a high film density and the silicon nitride film has a high sealing property, the sealing layer has a very small tolerance for bending. Accordingly, a crack may appear in the silicon nitride film and therefore the sealing property may deteriorate.

In view of this, for example, an organic film may be formed on the silicon nitride film to help to prevent deterioration of the sealing property of the silicon nitride film and to help to improve sealing property.

Meanwhile, organic EL display panels of greater sizes are being developed recently, and a wet process of applying an ink (solution) including a resin material with use of an inkjet device or the like is proposed as an efficient method of manufacturing an organic film in such large-size organic EL display panels.

In such an inkjet device, when air bubbles are present in an ink for some reason, a pressure generated in order to eject an ink droplet may be absorbed by the air bubbles, which may give rise to an ink ejection failure. Due to this, an amount of the ink dropped onto a substrate may vary and forming of the organic film cannot be achieved properly in some cases.

Such air bubbles appearing in the ink are, for example, supersaturated gases appearing as air bubbles due to a solubility decrease of gases in the ink caused by a local pressure decline or a temperature increase.

In order to avoid problems as described above, a method of removing gases included in the ink with use of a deaeration device, supplying the ink after a deaeration process to a droplet ejection head, and applying the ink has been proposed (for example, see Japanese Patent Application Publication 2003-282246).

Recently, in many cases, the deaeration device has a structure in which the solution passes through a filter including a hollow fiber film and thereby air bubbles and dissolved gases are removed. This is because deaeration devices that make use of hollow fiber films can remove the dissolved gases efficiently.

However, if such a deaeration device including a hollow fiber film is used for a certain period of time, the hollow fiber film may become damaged and problems such as clogging and/or leakage of the ink may occur.

SUMMARY

An organic EL display panel manufacturing method pertaining to at least one embodiment of the present disclosure includes preparing a substrate. The method further includes forming a plurality of organic EL elements on the substrate. The method further includes deaerating a sealing solution with use of a filter that allows only gases to pass through, the sealing solution including an organic electrically-insulating material to which an electrically-conductive substance is added. The method further includes applying the sealing solution after the deaerating above the organic EL elements and thereby forming a sealing layer.

Further, a sealing layer forming device pertaining to at least one embodiment of the present disclosure includes a tank that stores a sealing solution including an organic electrically-insulating material to which an electrically-conductive substance is added. The sealing layer forming device further includes a deaeration unit that deaerates the sealing solution in the tank. The sealing layer forming device further includes an application unit that applies the sealing solution after deaerating above a plurality of organic EL elements disposed on a substrate.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

In the drawings:

FIG. 6A is a view of a state in which a thin film transistor (TFT) layer is formed on a base member, FIG. 6B is a view of a state in which an interlayer insulating layer is formed on a substrate, FIG. 6C is a view of a state in which a pixel electrode material layer is formed on the interlayer insulating layer, FIG. 6D is a view of a state in which a hole injection layer material layer is formed on the pixel electrode material layer, and FIG. 6E is a view of a state in which pixel electrode layers and hole injections layers are formed;

FIG. 7A is a view of a state in which a bank material layer is formed on the interlayer insulating layer and the hole injection layers above the pixel electrodes, FIG. 7B is a view of a state in which a bank layer is formed, FIG. 7C is a view of a state in which hole transport layers are formed on the hole injection layers, and FIG. 7D is a view of a state in which light-emitting layers are formed on the hole transport layers;

FIG. 8A is a view of a state in which an electron transport layer is formed on the light-emitting layers and the bank layer, FIG. 8B is a view of a state in which an electron injection layer is formed on the electron transport layer, FIG. 8C is a view of a state in which a counter electrode is formed on the electron injection layer, and FIG. 8D is a view of a state in which a first sealing layer is formed on the counter electrode;

FIG. 9A is a view of how a second sealing layer is formed on the first sealing layer, and FIG. 9B is a view of a state in which the second sealing layer is formed on the first sealing layer;

DETAILED DESCRIPTION

Figure 1:
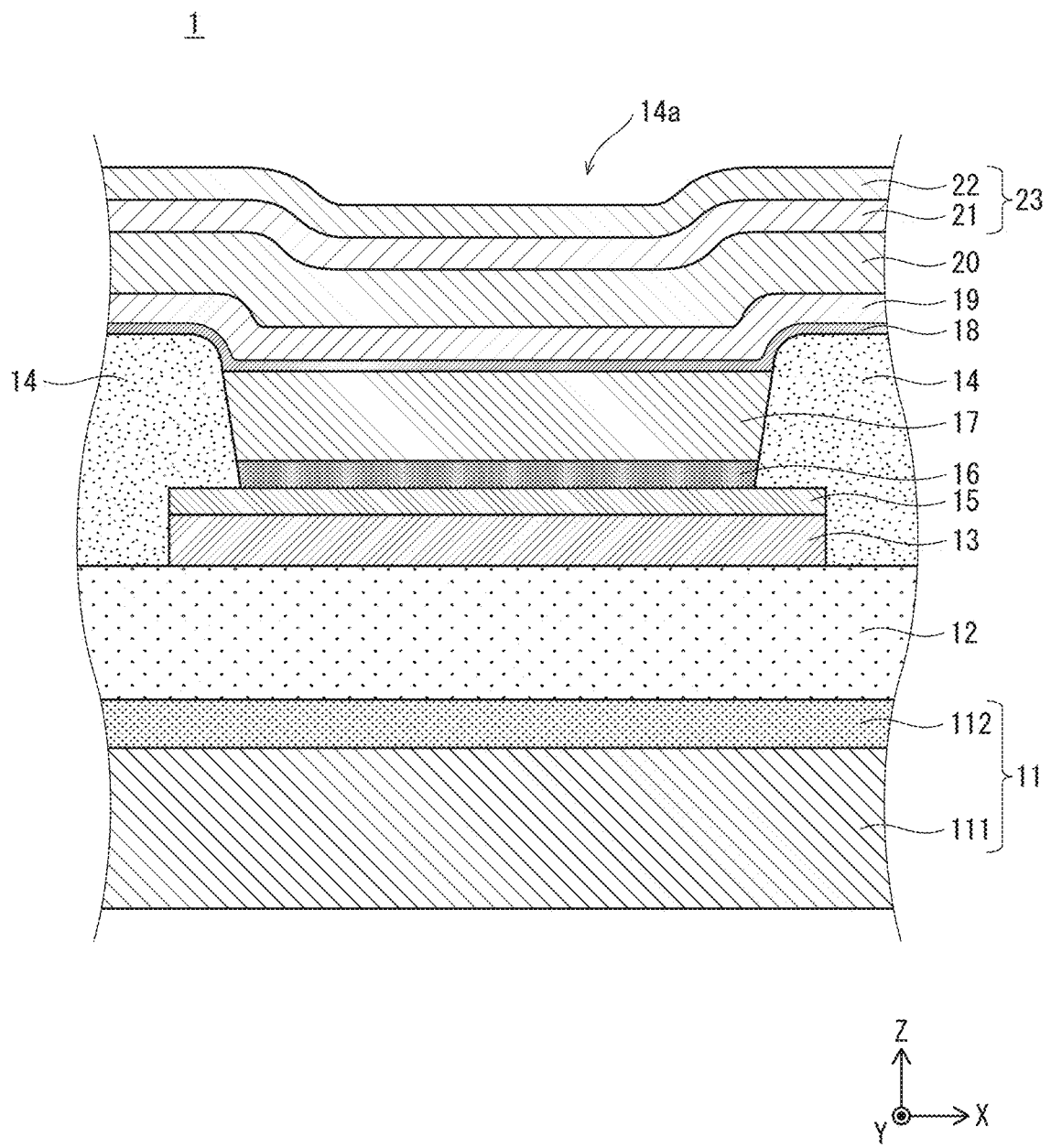
FIG. 1 is a schematic cross-sectional view of a structure of an organic EL element 1 pertaining to at least one embodiment.

<Circumstances Leading to Embodiment of Present Disclosure>

The inventor investigated why damage to the deaeration device occurs. The investigation revealed that a wall surface of the hollow fiber film is partially melted and is damaged. The investigation further revealed that such damage is caused by triboelectric charging between the ink including an organic electrically-insulating material and an inner wall surface of a filter including a hollow fiber film or the like.

That is, in many cases, a filter including a hollow fiber film or the like is made of a material that has a tolerance for organic solvents, such as a fluorine-based resin. Fluorine-based resins are substances, among the triboelectric series, that tend to be electrically charged easily. When the ink (solution) flows inside the filter, static electricity is generated due to friction between the inner wall surface of the hollow fiber and the ink (triboelectric charging). The organic material used as the ink is an electrically-insulating material, and therefore the static electricity is gradually accumulated in the inner wall surface of the filter. Eventually, a spark occurs, and the hollow fiber film is melted due to heat generated by the spark.

The inventor investigated a method of manufacturing a display panel in which problems such as solution leakage do not occur even when a filter including a hollow fiber film or the like is used in the deaeration process, and arrived at an embodiment of the present disclosure.

<Overview>

An organic EL display panel manufacturing method pertaining to at least one embodiment of the present disclosure includes preparing a substrate. The method further includes forming a plurality of organic EL elements on the substrate. The method further includes deaerating a sealing solution with use of a filter that allows only gases to pass through, the sealing solution including an organic electrically-insulating material to which an electrically-conductive substance is added. The method further includes applying the sealing solution after the deaerating above the organic EL elements and thereby forming a sealing layer.

According to this, even when static electricity is generated in the deaeration process due to triboelectric charging between the solution and the filter, the electrically-conductive substance in the solution allows the electrical charge to escape. This thus helps to prevent occurrence of sparks and consequent damaging of the filter.

Here, the term "deaerate" indicates partially or fully removing a gas included in the solution.

According to an organic EL display panel manufacturing method pertaining to at least one embodiment of the present disclosure, an electrical conductivity of the sealing solution is greater than $1.0 \times 10^{-12}$ S/m and equal to or smaller than 1.0 S/m.

This helps to effectively prevent occurrence of sparks in the deaeration process.

According to an organic EL display panel manufacturing method pertaining to at least one embodiment of the present disclosure, the filter includes a hollow fiber film made of a fluorine-based resin.

Fluorine-based resins have a great tolerance for organic solvents. A filter including a hollow fiber film made of a fluorine-based resin thus has a long life, and helps to achieve efficient deaerating and to improve productivity.

According to an organic EL display panel manufacturing method pertaining to at least one embodiment of the present disclosure, the electrically-conductive substance is an ionic liquid.

Ionic liquids have great thermostability and non-volatility. Further, adjusting compatibility of the ionic liquid with the resin helps to maintain a light transmittance of the resin, and addition of a small amount of the ionic liquid helps to prevent electrical charging to a great extent.

According to an organic EL display panel manufacturing method pertaining to at least one embodiment of the present disclosure, the organic electrically-insulating material is an ultraviolet-curing resin or a thermosetting resin.

These resins cure within a short period of time through ultraviolet irradiation or heating, and therefore help to improve productivity.

A sealing layer forming device pertaining to at least one embodiment of the present disclosure includes a tank that stores a sealing solution including an organic electrically-insulating material to which an electrically-conductive substance is added. The sealing layer forming device further includes a deaeration unit that deaerates the sealing solution in the tank. The sealing layer forming device further includes an application unit that applies the sealing solution after deaerating above a plurality of organic EL elements disposed on a substrate.

According to a sealing layer forming device pertaining to at least one embodiment of the present disclosure, an electrical conductivity of the sealing solution is greater than $1.0 \times 10^{-12}$ S/m and equal to or smaller than 1.0 S/m.

This structure helps to effectively prevent occurrence of sparks in the deaeration unit.

According to a sealing layer forming device pertaining to at least one embodiment of the present disclosure, the deaeration unit causes the sealing solution to pass through a filter including a hollow fiber film made of a fluorine-based resin, thereby deaerating the sealing solution.

According to a sealing layer forming device pertaining to at least one embodiment of the present disclosure, the electrically-conductive substance is an ionic liquid.

According to a sealing layer forming device pertaining to at least one embodiment of the present disclosure, the application unit is an inkjet device.

Inkjet devices can accurately and uniformly apply the sealing solution in areas in which the application is to be performed even when forming a large-size organic EL display panel, and therefore the solution is not wasted. This has a great productivity.

An organic EL display panel pertaining to at least one embodiment of the present disclosure includes a substrate. The organic EL display panel further includes a plurality of organic EL elements disposed on the substrate. The organic EL display panel further includes a sealing layer disposed above the organic EL elements. In the organic EL display panel, the sealing layer includes an organic electrically-insulating material in which an electrically-conductive substance is dispersed.

According to an organic EL display panel pertaining to at least one embodiment of the present disclosure, an electrical conductivity of the sealing layer is greater than $1.0 \times 10^{-12}$ S/m and equal to or smaller than 1.0 S/m.

Embodiment

The following describes an organic EL element pertaining to at least one embodiment of the present disclosure. Note that the following description is an exemplification for describing a structure, an operation, and an effect pertaining to at least one embodiment, and components that are not essential to the present disclosure are not limited to the embodiment described below.

1. Structure of Organic EL Elements

FIG. 1 is a partial cross-sectional view of an organic EL display panel 510 (see FIG. 11) pertaining to at least one embodiment. The organic EL display panel 510 includes a plurality of pixels each consisting of three subpixels. The subpixels each include an organic EL element emitting a different one of three colors red, green, and blue (R, G, and B). FIG. 1 illustrates a cross-section of one of the subpixels.

In the organic EL display panel 510, each of the organic EL elements is a so-called top-emission type of element emitting light forward (upward in a Z-axis direction in FIG. 1).

The organic EL elements of the three colors have a structure similar to each other, and therefore they are referred to as the organic EL elements 1 where they are not distinguished from one another.

In FIG. 1, the organic EL elements 1 each include a substrate 11, an interlayer insulating layer 12, a pixel electrode 13, a bank layer 14, a hole injection layer 15, a hole transport layer 16, a light-emitting layer 17, an electron transport layer 18, an electron injection layer 19, a counter electrode 20, and a sealing layer 23. The sealing layer 23 has a two-layered structure of a first sealing layer 21 and a second sealing layer 22.

Note that the substrate 11, the interlayer insulating layer 12, the electron transport layer 18, the electron injection layer 19, the counter electrode 20, and the sealing layer 23 do not correspond one-to-one with the pixels but span over the organic EL elements 1 of the organic EL display panel 510.

(1) Substrate

The substrate 11 includes a base member 111 that is made of an electrically-insulating material and a thin film transistor (TFT) layer 112. The TFT layer 112 includes drive circuits corresponding one-to-one with the subpixels. The base member 111 may be, for example, a glass substrate; a silica glass substrate; a silicon substrate; a metal substrate of a metal such as molybdenum sulfide, copper, zinc, aluminum, stainless steel, magnesium, iron, nickel, gold, silver, or the like; a semiconductor substrate such as gallium arsenide; a plastic substrate, or similar.

For a plastic material for the plastic substrate, a thermoplastic resin or a thermosetting resin may be used. For example, polyethylene; polypropylene; polyamide; polyimide (PI); polycarbonate; an acrylic resin; polyethylene terephthalate (PET); polybutylene terephthalate; polyacetal; other fluorine-based resins; thermoplastic elastomer such as styrenic elastomer, polyolefin elastomer, polyvinyl chloride elastomer, polyurethane elastomer, fluorine rubber elastomer, and chlorinated polyethylene elastomer; an epoxy resin; an unsaturated polyester; a silicone resin; polyurethane, or the like, or copolymer, blend, polymer alloy or the like mainly including such a material, primarily consisting of one of the above, or a layered body including layers of one or more of the above can be used.

(2) Interlayer Insulating Layer

The interlayer insulating layer 12 is disposed on the substrate 11. The interlayer insulating layer 12 is made of a resin material and planarizes unevenness of an upper surface of the TFT layer 112. For the resin material, for example, a positive photosensitive material is used. Examples of such a photosensitive material are an acrylic resin, a polyimide resin, a siloxane resin, and a phenolic resin. Further, although not illustrated in the cross-sectional view of FIG. 1, the interlayer insulating layer 12 has contact holes corresponding one-to-one with the pixels.

(3) Pixel Electrodes

The pixel electrodes 13 each include a metal layer made of a light-reflective metal material and are disposed on the interlayer insulating layer 12. The pixel electrodes 13 correspond one-to-one with the subpixels and are electrically connected to the TFT layer 112 through the contact holes (not illustrated).

In the present embodiment, the pixel electrodes 13 function as anodes.

Specific examples of a metal material having light-reflectivity are silver (Ag); aluminum (Al); an aluminum alloy; molybdenum (Mo); a silver, palladium, and copper alloy (APC); a silver, rubidium, gold alloy (ARA); a molybdenum chromium alloy (MoCr); a molybdenum tungsten alloy (MoW); a nickel chromium alloy (NiCr), and the like.

The pixel electrodes 13 may each be a single metal layer or may each have a layered structure in which a layer made of a metal oxide such as indium tin oxide (ITO) or indium zinc oxide (IZO) is laminated on a metal layer.

(4) Bank Layer

The bank layer 14 is disposed on the hole injection layer 15 with portions of upper surfaces of the hole injection layer 15 being exposed and regions around the exposed portions of the upper surfaces of the hole injection layer 15 being covered by the bank layer 14. Regions in the upper surfaces of the hole injection layer 15 that are not covered by the bank layer 14 (hereinafter referred to as "openings") correspond one-to-one with the subpixels. That is, the bank layer 14 has openings 14a corresponding one-to-one with the subpixels.

In the present embodiment, the bank layer 14 is on the interlayer insulating layer 12 in regions in which the pixel electrodes 13 are not present. That is, in portions in which the pixel electrodes 13 are not present, a bottom surface of the bank layer 14 is in contact with an upper surface of the interlayer insulating layer 12.

The bank layer 14 is made of, for example, an electrically-insulating organic material (such as an acrylic resin, a polyimide resin, a novolac resin, a phenolic resin, or the like). When the light-emitting layers 17 are formed through an application process, the bank layer 14 functions as a structure for preventing the applied ink from flowing out. When the light-emitting layers 17 are formed through vapor deposition, the bank layer 14 functions as a structure for placing a vapor deposition mask. In the present embodiment, the bank layer 14 is made of a resin material. For a material of the bank layer 14, an acrylic resin, a polyimide resin, a siloxane resin, or a phenolic resin can be used. In the present embodiment, a phenolic resin is used.

(5) Hole Injection Layers

The hole injection layers 15 are disposed on the pixel electrodes 13 for the purpose of promoting injection of holes from the pixel electrodes 13 to the light-emitting layers 17. The hole injection layers 15 are layers made of, for example, an oxide of a material such as silver (Ag), molybdenum (Mo), chromium (Cr), vanadium (V), tungsten (W), nickel (Ni), or iridium (Ir), or an electrically conductive polymer material such as poly(3,4-ethylenedioxythiophene) polystyrene sulfonate (PEDOT:PSS).

Among the above examples, hole injection layers 15 made of a metal oxide have a function of injecting holes to the organic light-emitting layers 17 by stabilizing holes or assisting in generation of holes, and have a high work function.

In the present embodiment, the hole injection layers 15 are made of tungsten oxide. In cases of hole injection layers 15 being made of a transition metal oxide, a plurality of energy levels can be obtained from a plurality of valences, and as a result hole injection becomes easier and drive voltage can be decreased.

(6) Hole Transport Layers

The hole transport layers 16 include a polymer compound having no hydrophilic group and are disposed in the openings 14a. For example, a large-molecule compound that has no hydrophilic group may be used, such as polyfluorene, a derivative thereof, polyarylamine, or a derivative thereof.

The hole transport layers 16 have a function of transporting holes injected from the hole injection layers 15 to the light-emitting layers 17.

(7) Light-Emitting Layers

The light-emitting layers 17 are in the openings 14a and each have a function of emitting light of one of the colors R, G, and B through recombination of holes and electrons. For a material of the light-emitting layers 17, a known material can be used. Specifically, for example, as described in Japanese Patent Application Publication H5-163488, the light-emitting layers 17 are beneficially made of a fluorescent substance such as an oxynoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

(8) Electron Transport Layer

The electron transport layer 18 has a function of transporting electrons from the counter electrode 20 to the light-emitting layers 17. The electron transport layer 18 is made of an organic material having a high electron transport property, and includes neither alkali metals nor alkaline earth metals.

For the organic material for the electron transport layer 18, for example, a π electron system small-molecule organic material such as an oxadiazole derivative (OXD), a triazole derivative (TAZ), a phenanthroline derivative (BCP, Bphen), or the like can be used.

(9) Electron Injection Layer

The electron injection layer 19 has a function of injecting electrons from the counter electrode 20 toward the light-emitting layers 17. The electron injection layer 19 is made of, for example, an organic material that has a high electron transport property and that is doped with a metal selected from alkali metals and alkaline earth metals. In the present embodiment, the electron injection layer 19 is doped with barium (Ba).

Examples of alkali metals are lithium (Li), sodium (Na), potassium (K), rubidium (Rb), cesium (Cs), and francium (Fr). Examples of alkaline earth metals are calcium (Ca), strontium (Sr), barium (Ba), and radium (Ra).

For the organic material for the electron injection layer 19, for example, a π electron system small-molecule organic material such as an oxadiazole derivative (OXD), a triazole derivative (TAZ), a phenanthroline derivative (BCP, Bphen), or the like can be used.

(10) Counter Electrode

The counter electrode 20 is made of a light-transmissive electrically-conductive material and is disposed on the electron injection layer 19. The counter electrode 20 functions as a cathode.

For a material of the counter electrode 20, for example, ITO or IZO can be used. Alternatively, for a material of the counter electrode 20, a metal such as silver, a silver alloy, aluminum, an aluminum alloy, or the like may be used. In this case, the counter electrode 20 needs to have a light transmittance. Accordingly, the counter electrode 20 is a thin film having a thickness of 20 nm or less.

(11) Sealing Layer

The sealing layer 23 has a function of preventing organic layers such as the hole transport layers 16, the light-emitting layers 17, the electron transport layer 18, and the electron injection layer 19 from deteriorating because of being exposed to moisture, air, or the like. In the present embodiment, the sealing layer 23 has a two-layered structure of a first sealing layer 21 and a second sealing layer 22.

The first sealing layer 21 is made of, for example, a light-transmissive material such as silicon nitride (SiN), silicon oxynitride (SiON), or the like.

The second sealing layer 22 is made of, for example, an ultraviolet-curing resin in which components of an ionic liquid are dispersed. The second sealing layer 22 reinforces the first sealing layer 21 and prevents organic functional layers below the sealing layer 23 from coming into a direct contact with external air even when a crack appears in the first sealing layer 21.

Note that the organic EL display panel 510 of the present embodiment is a top-emission type of panel and therefore the second sealing layer 22 is made of a light-transmissive resin material.

(12) Other Components

Although not illustrated in FIG. 1, a color filter or an upper substrate may be joined to the second sealing layer 22. Through joining the upper substrate, the hole transport layers 16, the light-emitting layers 17, the electron transport layer 18, and the electron injection layer 19 are further protected from moisture, air, or the like.

2. Sealing Layer Forming Device

The following describes the structure of a sealing layer forming device that forms the second sealing layer of the organic EL display panel pertaining to the present embodiment through the wet process.

The sealing layer forming device includes an ink supply unit 1100 and an inkjet device 1200.

(1) Ink Supply Unit 1100

Figure 2:
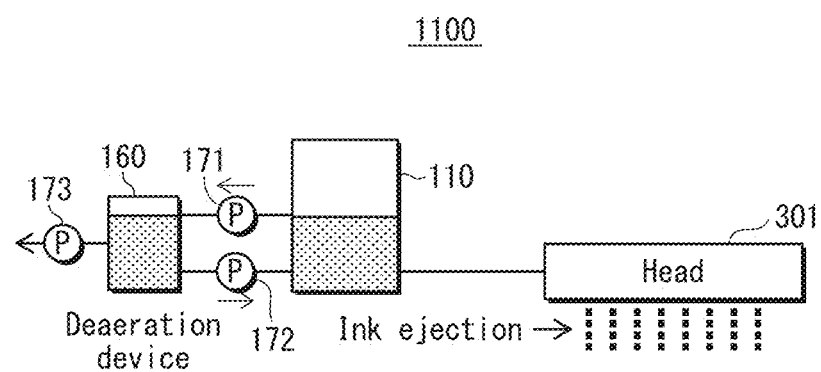
FIG. 2 is a schematic diagram of a structure of an ink supply unit in a sealing layer forming device pertaining to at least one embodiment, which is used for forming a second sealing layer.

FIG. 2 is a schematic diagram of the structure of the ink supply unit 1100 pertaining to at least one embodiment.

In FIG. 2, the ink supply unit 1100 includes a supply tank 110, a deaeration device 160, transfer pumps 171 and 172, and a vacuum pump 173.

The supply tank 110 stores an ink that is a material for the second sealing layer 22. The ink includes an ultraviolet-curing resin to which an ionic liquid that functions as an electrically-conductive substance is added.

The ultraviolet-curing resin may be any kind of known ultraviolet-curing resin such as urethane acrylate, acrylic resin acrylate, epoxy acrylate, or the like. However, in top-emission type organic EL display panels, an ultraviolet-curing resin having a high light transmittance is beneficial.

The ionic liquid is a salt that exists as a liquid at room temperature. Optimizing the structure of the ionic liquid and adjusting compatibility with a resin help to maintain the light transmittance of the resin, and addition of a small amount of the ionic liquid helps to prevent electrical charging of the resin to a great extent. Further, such an ionic liquid has a great heat resistance and can be mixed into a resin such as polycarbonate.

Examples of cations in the ionic liquid are ammonium-based, phosphonium-based, sulfonium-based, imidazolium-based, or pyridine-based organic cations. Examples of anions in the ionic liquid are $AlCl_4^-$, $I^-$, $BF_4^-$, $PF_6^-$, $AsF_6^-$, $SbF_6^-$, $NbF_6^-$, $CF_3SO_3^-$, $C(CF_3SO_2)_3^-$, $C_3F_7CO_2^-$, $C_4F_9SO_3^-$, $N(CF_3SO_2)_2^-$, $N(C_2F_5SO_2)_2^-$, and $N(CF_3SO_2)(CF_3CO)^-$. Many of these cations and anions are commercially available.

Note that the ionic liquid is not limited to the ionic liquid described, and any ionic liquid that is added to an organic electrically-insulating material to impart an electrical conductivity to the organic electrically-insulating material can be used.

The ink stored in the supply tank 110 is caused to circulate through the deaeration device 160 by the transfer pumps 171 and 172 and is deaerated.

The ink in the supply tank 110 after the deaeration process is supplied to an inkjet head 301 of the inkjet device 1200 (FIG. 5) and is ejected onto the first sealing layer 21 to form the second sealing layer 22.

(2) Deaeration Device

Figure 3A:
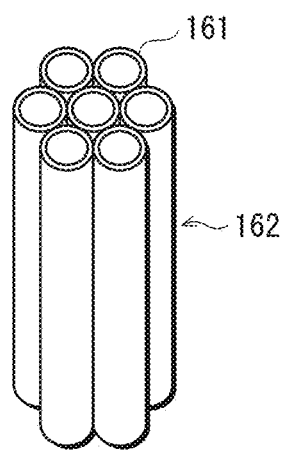
FIG. 3A and FIG. 3B are diagrams for describing how a deaeration device in the sealing layer forming device pertaining to at least one embodiment operates.
Figure 3B:
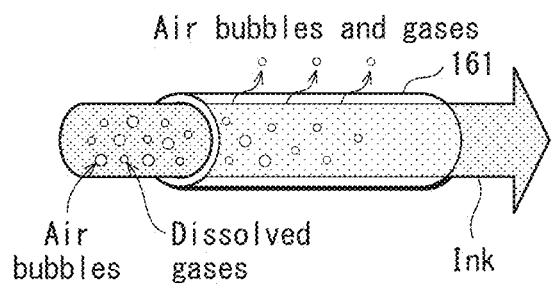

FIG. 3A and FIG. 3B are diagrams of how deaerating by the deaeration device 160 pertaining to at least one embodiment is performed.

Inside the deaeration device 160, a bundle of hollow fiber films 161 (hollow fiber film bundle 162) in FIG. 3A is stored. The hollow fiber films 161 are filter films through which gases pass but liquids do not pass.

Examples of a material for the hollow fiber films 161 are polyolefin resins such as polypropylene and Poly(4-methyl-1-pentene), silicone resins such as polydimethylsiloxane and copolymer thereof, fluorine-based resins such as polytetrafluoroethylene (PTFE) and perfluoroalkoxy polymer (PFA), and the like. Specifically, a fluorine-based resin having a tolerance for the organic solvents of the ink is beneficial.

Note that the film shapes (shapes of side walls) of the hollow fiber films 161 may be, for example, porous, microporous, or homogeneous (not having porosity).

When the ink passes through the hollow fiber films 161 and a pressure around the hollow fiber films 161 is reduced to or close to vacuum as in FIG. 3B, only air bubbles in the ink and gases dissolved in the ink pass outside through the side walls of the hollow fiber film 161, and thus the deaeration process is achieved.

Figure 4:
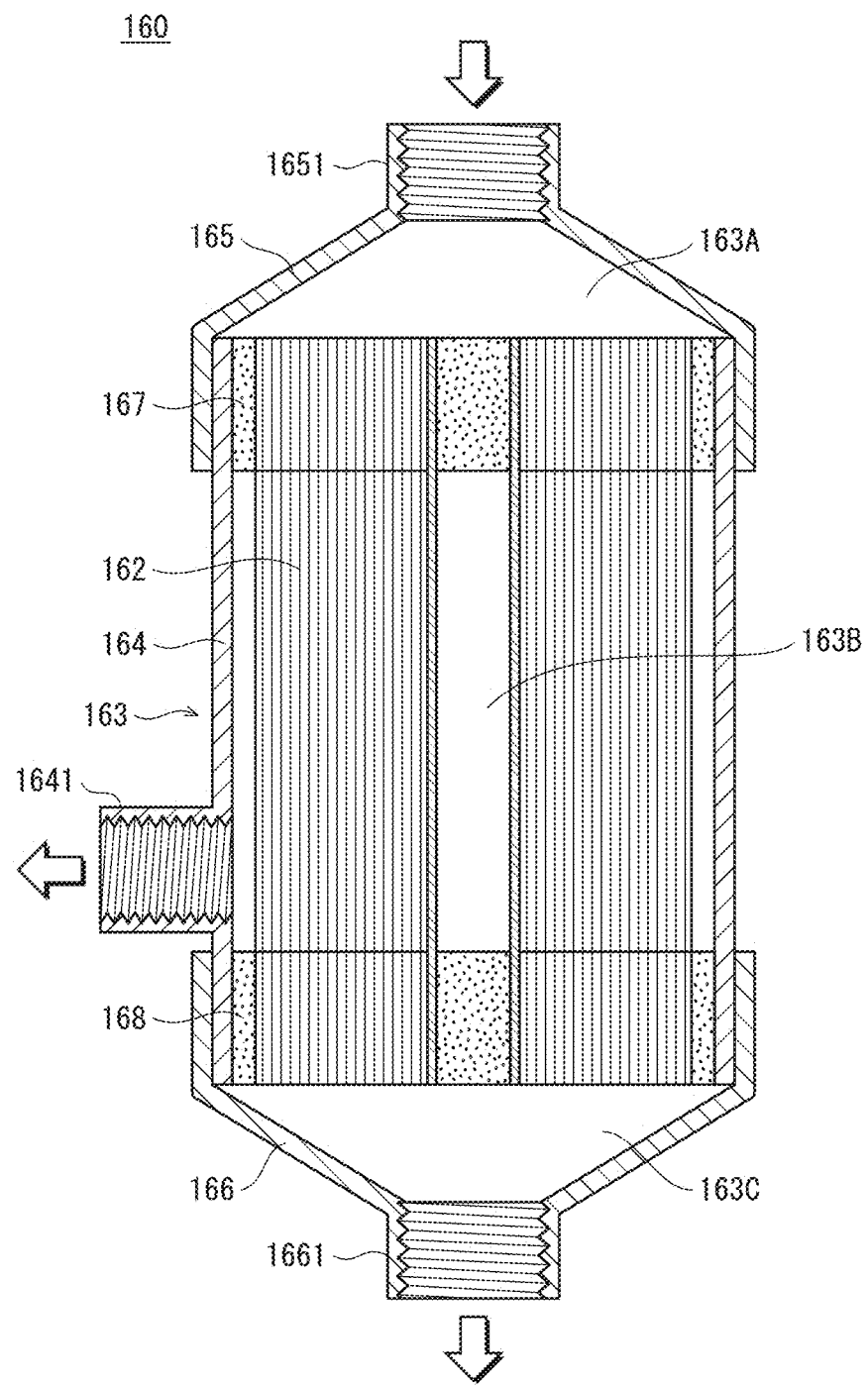
FIG. 4 is a schematic cross-sectional view of a structure of a deaeration device pertaining to at least one embodiment.

FIG. 4 is a schematic cross-sectional view of an example of a structure of the deaeration device 160 pertaining to at least one embodiment.

In FIG. 4, the deaeration device 160 includes the hollow fiber film bundle 162, which is a bundle of the hollow fiber films 161, and a housing 163 in which the hollow fiber film bundle 162 is stored.

The housing 163 includes a cylindrical portion 164, a first lid portion 165 attached to an upper opening of the cylindrical portion 164, and a second lid portion 166 attached to a lower opening of the cylindrical portion 164.

A space in the housing 163 is divided by a first sealing portion 167 and a second sealing portion 168 into three airtight spaces 163A, 163B, and 163C. One end of the hollow fiber film bundle 162 is held by the first sealing portion 167, and the other end of the hollow fiber film bundle 162 is held by the second sealing portion 168. The first sealing portion 167 and the second sealing portion 168 are each made of a resin. For the resin for the first sealing portion 167 and the second sealing portion 168, for example, an epoxy resin, an urethane resin, an ultraviolet-curing resin, a polyolefin resin, or the like can be used.

A suction outlet 1641 for exhausting air in the space 163B is at a side surface of the cylindrical portion 164. The first lid portion 165 has an ink supply inlet 1651, and the second lid portion 166 has an ink outlet 1661.

The ink transferred by the transfer pump 171 (see FIG. 2) flows from the supply inlet 1651 into the space 163A in the first lid portion 165, flows inside the hollow fiber film bundle 162 and out into the space 163C in the second lid portion 166, is discharged from the outlet 1661, and is returned by the transfer pump 172 into the supply tank 110.

A pressure in the space 163B in the cylindrical portion 164 is reduced through the suction outlet 1641 by the vacuum pump 173. This causes air bubbles in the ink and/or gases dissolved in the ink that flow in the hollow fiber film bundle 162 to pass through into the space 163B, and therefore the deaeration process is achieved.

It is beneficial that all the gases dissolved in the ink be removed through the deaeration process. However, the gases dissolved in the ink may partially remain in the ink as long as the gases remaining in the ink would not affect film-forming through an inkjet process in the sealing layer forming process.

When the ink is composed of an organic electrically-insulating material such as an ultraviolet-curing resin, static electricity is generated due to friction between inner walls of the hollow fiber films 161 and the ink when the ink flows inside the hollow fiber films 161. Due to this, inner surfaces of the side walls of the hollow fiber films 161 are electrically charged and have a high electric potential, and the electrical charge causes a spark and damages the hollow fiber films 161. In contrast, in the structure of the present embodiment in which a small amount of ionic liquid is added to the ink, the static electricity is removed through the ionic liquid, which prevents occurrence of sparks. This helps to achieve the deaeration device 160 having a long life.

Note that addition of a small amount of the ionic liquid to the ultraviolet-curing resin is sufficient; specifically, an amount that is necessary for removing the static electricity charge in the inner walls of the above-described hollow fiber films 161 is sufficient.

More specifically, the ink for sealing which is obtained by adding the ionic liquid into the organic electrically-insulating material beneficially has an electrical conductivity greater than $1.0 \times 10^{-12}$ S/m and equal to or smaller than 1.0 S/m.

When the electrical conductivity of the ink is $1.0 \times 10^{-12}$ S/m or less, a satisfactory electrical discharging effect cannot be obtained. In such cases, static electricity is gradually charged in the hollow fiber films 161 when the hollow fiber films 161 are used for a long time, which may result in occurrence of sparks.

Further, it is beneficial that the electrical conductivity of the ink be 1.0 S/m or less due to the following perspectives.
(A) In top-emission type organic EL display panels, it is beneficial that the sealing layer have a light transmittance of at least 85% in design. If the amount of the electrically-conductive substance (ionic liquid) added to improve the electrical conductivity of the ink is too large, the sealing layer after curing may have a light transmittance lower than 85%.
(B) When the electrical conductivity of the second sealing layer 22 is too great and the second sealing layer 22 comes into contact with wiring in a peripheral portion of the substrate, an unintended electrical conduction may occur and this may cause problems such as decline of applied voltage and/or decline of luminance.

Further, it is more beneficial that the electrical conductivity of the ink be greater than $1.0 \times 10^{-10}$ S/m and equal to or smaller than $1.0 \times 10^{-7}$ S/m.

The specific amount of the ionic liquid added to the ink is determined through experiments or the like such that the electrical conductivity of the ink is in a range described above, taking into account conditions such as the kind of the organic electrically-insulating material and the charge number of the ionic liquid.

(3) Inkjet Device

Figure 5:
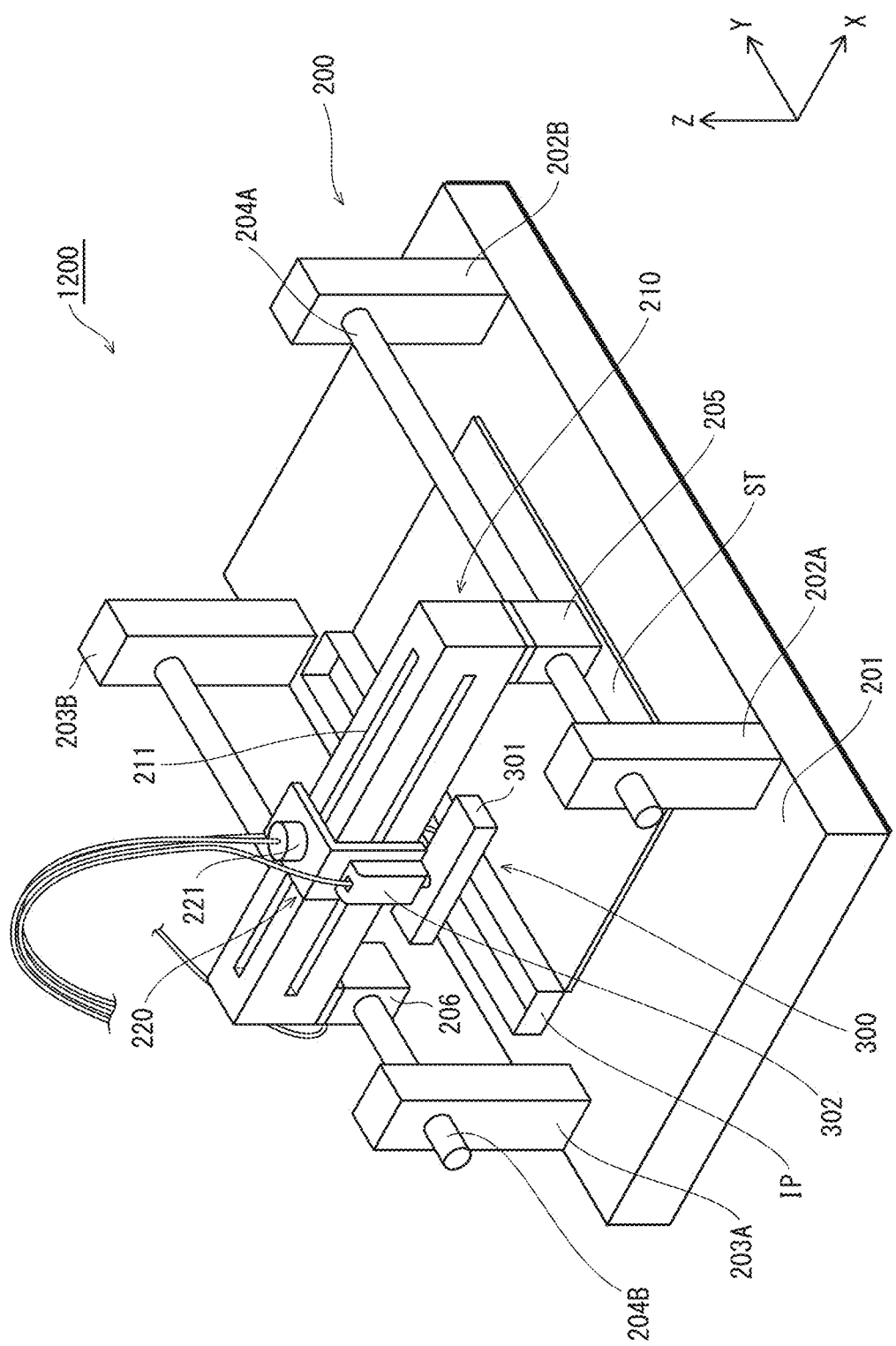
FIG. 5 is a diagram of a structure of an inkjet device in the sealing layer forming device pertaining to at least one embodiment.

FIG. 5 is a diagram of main components of the inkjet device 1200 pertaining to at least one embodiment.

In FIG. 5, the inkjet device 1200 includes an inkjet table 200 and a head portion 300.

(3-1) Inkjet Table

In FIG. 5, the inkjet table 200 is a gantry type operation table. Above a table of a base of the inkjet table 200, a gantry portion (movement base) that is movable along a pair of guide shafts is arranged.

Specifically, the inkjet table 200 includes a plate-like base 201 and four pillar stands 202A, 202B, 203A, and 203B that stand at four corners of an upper surface of the base 201. In an inner region surrounded by the stands 202A, 202B, 203A, and 203B, a fixing stage ST and an ink pan (dish-like container) IP are arranged. The fixing stage ST is a stage on which a substrate that is a target of application is placed. The ink pan IP is a pan into which the ink is ejected immediately before application in order to stabilize ejection characteristics of the ink.

The stands 202A and 202B hold the guide shaft 204A in parallel with a longitudinal direction (Y-axis direction) of the base 201, and the stands 203A and 203B hold the guide shaft 204B in parallel with the longitudinal direction (Y-axis direction) of the base 201.

Further, the gantry portion 210 is held by the guide shaft 204A through a linear motor 205 and by the guide shaft 204B through a linear motor 206.

Due to this structure, when the inkjet device 1200 is driven, the pair of linear motors 205 and 206 are driven to allow slidable reciprocating motion of the gantry portion 210 along a longitudinal direction (Y-axis direction) of the guide shafts 204A and 204B.

On the gantry portion 210, a carriage (moving body) 220 that is an L-shaped pedestal is disposed. On the carriage 220, a servomotor 221 is disposed, and a gear that is not illustrated is attached to a tip of a drive shaft of the servomotor 221. The gear meshes with a fine-pitched rack in a guide groove 211 extending along a longitudinal direction (X-axis direction) of the gantry portion 210. When the servomotor 221 is driven, a precise reciprocating motion of the carriage 220 along the X-axis direction is achieved by a so-called rack and pinion mechanism.

The head portion 300 is mounted to the carriage 220. By moving the gantry portion 210 along the longitudinal direction of the guide shafts 204A and 204B with the carriage 220 fixed relative to the gantry portion 210 or by moving the carriage 220 along the longitudinal direction of the gantry portion 210 with the gantry portion 210 stopped, the head portion 300 is caused to scan an application target substrate. The main scanning direction of the head portion 300 is the row direction (X-axis direction), and the sub scanning direction of the head portion 300 is the column direction (Y-axis direction).

Note that the linear motors 205 and 206 and the servomotor 221 are driven and controlled by a control unit that is not illustrated.

(3-2) Head Portion

The head portion 300 uses a known piezoelectric system and includes the inkjet head 301 and a main body portion 302. The inkjet head 301 is supported by the carriage 220 through the main body portion 302. The main body portion 302 has a servomotor therein, and this servomotor causes the inkjet head 301 to move upward and downward in a Z-axis direction.

The inkjet head 301 has a plurality of nozzles 3011 (not illustrated in FIG. 5; see FIG. 7C, etc.) on a surface facing the fixing stage ST (ejection surface). The nozzles 3011 are arrayed along a longitudinal direction of the inkjet head 301. The ink supplied to the inkjet head 301 is ejected as droplets from the nozzles 3011 to the application target substrate.

Operations of ejecting droplets from the nozzles 3011 are controlled by drive voltages supplied to piezoelectric elements that the nozzles 3011 include. Controlling drive signals supplied from the control unit that is not illustrated to the piezoelectric elements causes the nozzles 3011 to eject droplets.

The second sealing layer is formed through the wet process with use of the sealing layer forming device having the structure described above. Note that the sealing layer forming device can be used for forming of organic functional layers such as hole injection layers and light-emitting layers by using different inks.

4. Organic EL Elements Manufacturing Method

The following describes a method of manufacturing organic EL elements 1, with reference to the drawings. FIG. 6A, FIG. 6B, FIG. 6C, FIG. 6D, FIG. 6E, FIG. 7A, FIG. 7B, FIG. 7C, FIG. 7D, FIG. 8A, FIG. 8B, FIG. 8C, FIG. 8D, FIG. 9A, and FIG. 9B are schematic cross-sectional views of states in processes of manufacturing the organic EL elements 1 pertaining to at least one embodiment. FIG. 10 is a flowchart of a method of manufacturing the organic EL elements 1 pertaining to at least one embodiment.

(1) Forming Substrate 11

Figure 6A:
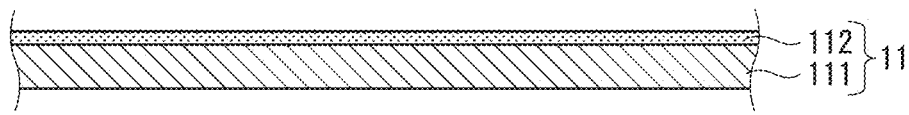
FIG. 6A, FIG. 6B, FIG. 6C, FIG. 6D, and FIG. 6E are schematic cross-sectional views of processes of manufacturing organic EL elements pertaining to at least one embodiment.

First, in FIG. 6A, the substrate 11 is formed through forming the TFT layer 112 on the base member 111 (step S1 in FIG. 10) through a known TFT manufacturing method.

Figure 6B:
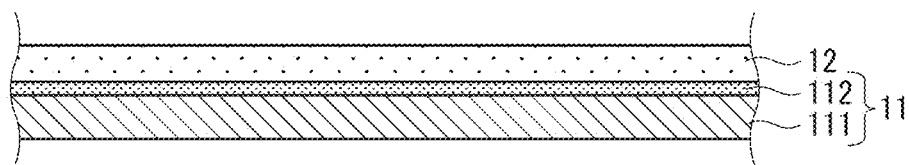

Next, in FIG. 6B, the interlayer insulating layer 12 is formed on the substrate 11 (step S2 in FIG. 10) through laminating with use of, for example, PECVD, sputtering, or the like.

Then, portions of the interlayer insulating layer 12 on source electrodes of the TFT layer are dry-etched to form the contact holes (not illustrated). The contact holes are formed such that surfaces of the source electrodes are exposed at the bottom of the contact holes.

Next, connection electrode layers are formed along inner walls of the contact holes. Upper portions of the connection electrode layers are partially over the interlayer insulating layer 12. The connection electrode layers are formed through, for example, sputtering. Specifically, the connection electrode layers are formed through forming a metal film and patterning the metal film through photolithography and wet-etching.

(2) Forming Pixel Electrodes 13 and Hole Injection Layers 15

Figure 6C:
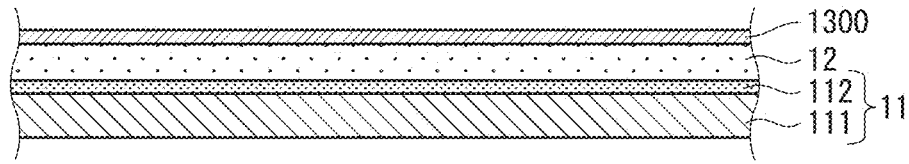

Next, in FIG. 6C, a pixel electrode material layer 1300 is formed on the interlayer insulating layer 12 (step S3 in FIG. 10) through, for example, vacuum vapor deposition, sputtering, or the like.

Figure 6D:
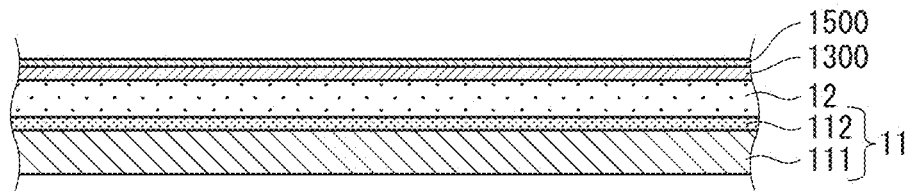

Next, in FIG. 6D, a hole injection material layer 1500 is formed on the pixel electrode material layer 1300 (step S4 in FIG. 10) through, for example, reactive sputtering or the like.

Figure 6E:
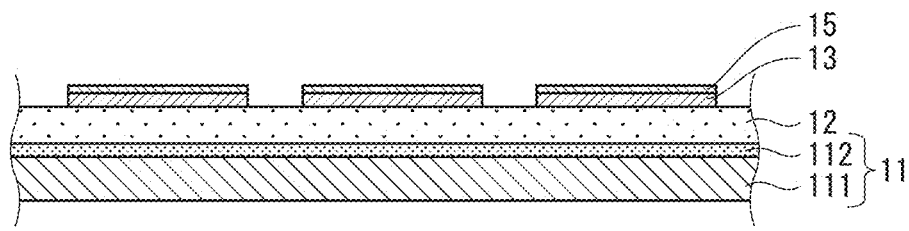

Next, in FIG. 6E, the pixel electrode material layer 1300 and the hole injection material layer 1500 are patterned through etching to form the pixel electrodes 13 and the hole injection layers 15 that are separated to correspond one-to-one with the subpixels (step S5 in FIG. 10).

Note that processes for forming the pixel electrodes 13 and the hole injection layers 15 are not limited to the processes described above. For example, forming of the hole injection layers 15 may be performed after forming the pixel electrodes 13 through patterning the pixel electrode material layer 1300.

(3) Forming Bank Layer 14

Figure 7A:
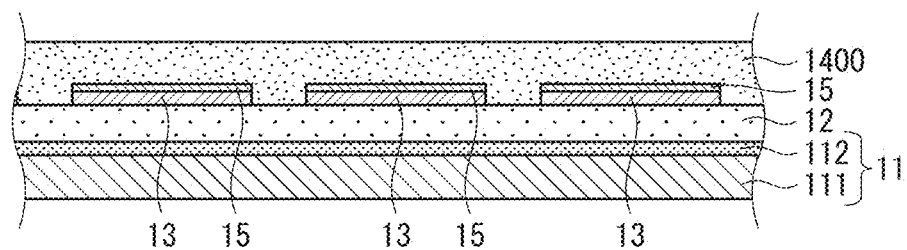
FIG. 7A, FIG. 7B, FIG. 7C, and FIG. 7D are schematic cross-sectional views of processes of manufacturing the organic EL elements pertaining to at least one embodiment.
Figure 7B:
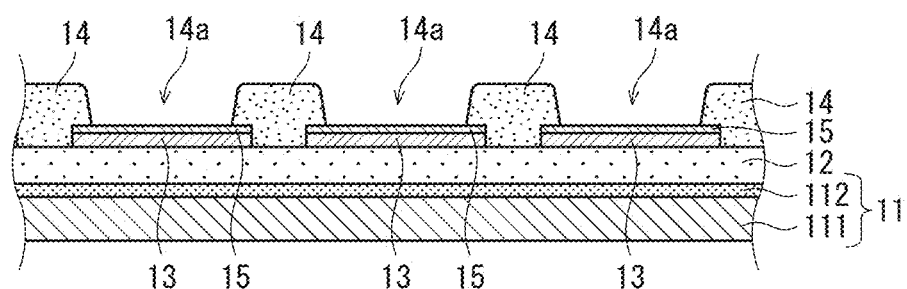

Next, in FIG. 7A, a bank layer resin that is a material for the bank layer 14 is applied on the hole injection layers 15 and the interlayer insulating layer 12 to form a bank material layer 1400. Specifically, the bank material layer 1400 is formed through obtaining a solution by dissolving a phenolic resin that is the bank layer resin into a solvent (such as a mixed solvent of ethyl lactate and γ-Butyrolactone (GBL)) and uniformly applying the solution on the hole injection layers 15 and the interlayer insulating layer 12 through spin coating or the like.

Then, the bank layer 14 is formed through applying pattern exposure and developing to the bank material layer 1400 (FIG. 7B and step S6 in FIG. 10), and the bank layer 14 is baked (step S7 in FIG. 10). Due to this, the openings, which are regions in which the light-emitting layers 17 are formed, are defined. Baking of the bank layer 14 is performed, for example, for sixty minutes at a temperature from 150° C. to 210° C.

Further, in the process of forming the bank layer 14, a surface of the bank layer 14 may be treated by using a defined liquid such as an alkaline solution, water, an organic solvent, or the like, or through applying a plasma treatment. This is performed for the purpose of adjusting the angle of contact between the bank layer 14 and the ink (solution) to be ejected into the openings 14a or for the purpose of providing the surface of the bank layer 14 with moisture repellency.

(4) Forming Hole Transport Layers 16

Figure 7C:
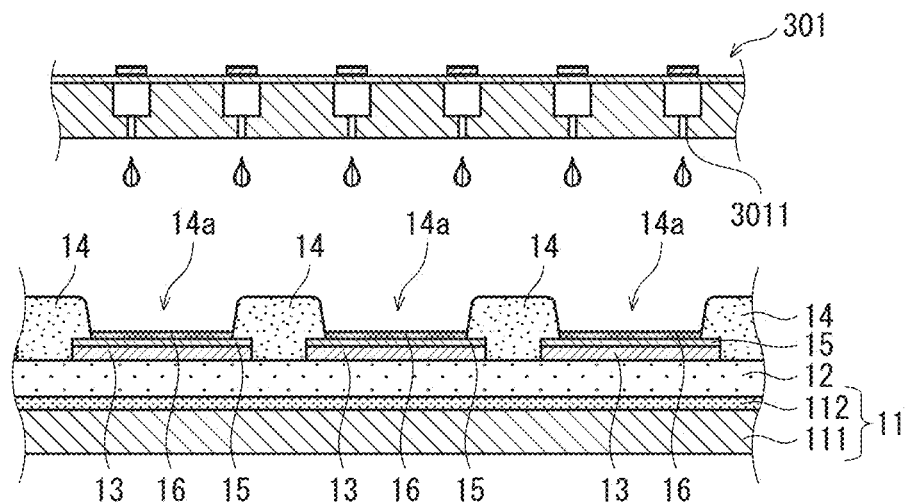

Next, in FIG. 7C, an ink including a component material of the hole transport layers 16 is applied to the openings 14a, which are defined by the bank layer 14, through ejecting the ink from the nozzles 3011 of the inkjet head 301 onto the hole injection layers 15 in the openings 14a, and drying (baking) is performed to form the hole transport layers 16 (step S8 in FIG. 10).

(5) Forming Light-Emitting Layers 17

Figure 7D:
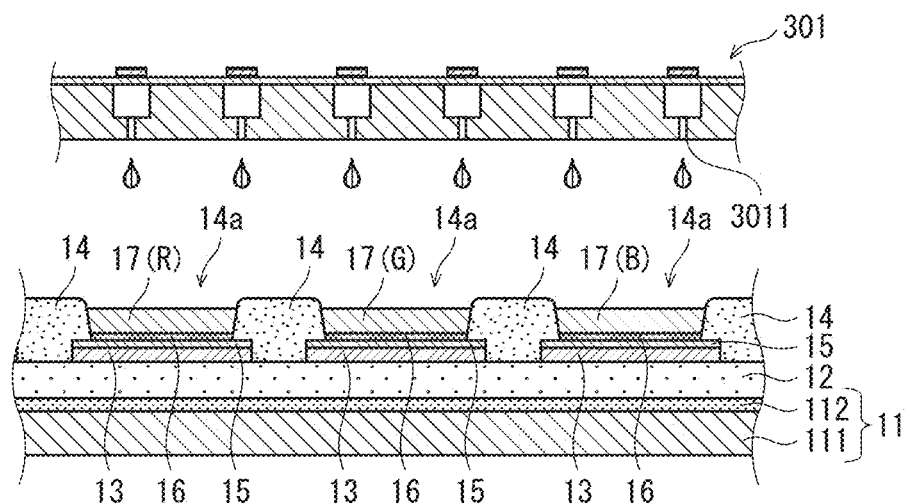

Next, in FIG. 7D, an ink including a component material of the light-emitting layers 17 is applied through ejecting the ink from the nozzles 3011 of the inkjet head 301 onto the hole transport layers 16 in the openings 14a, and drying (baking) is performed to form the light-emitting layers 17 (step S9 in FIG. 10).

(6) Forming Electron Transport Layer 18

Figure 8A:
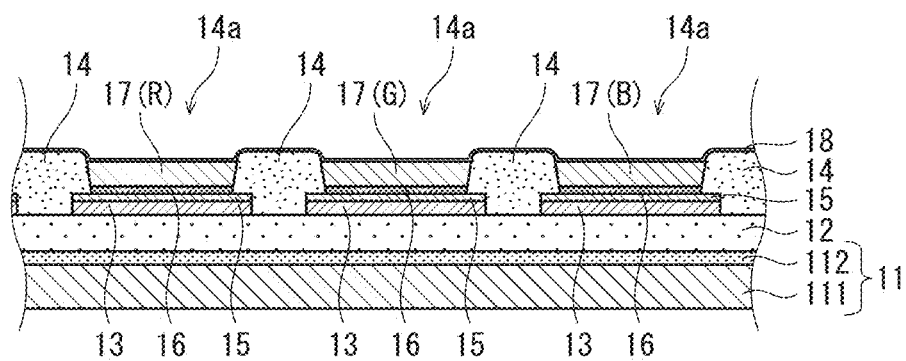
FIG. 8A, FIG. 8B, FIG. 8C, and FIG. 8D are schematic cross-sectional views of processes of manufacturing the organic EL elements pertaining to at least one embodiment.

Next, in FIG. 8A, the electron transport layer 18 is formed on the light-emitting layers 17 and the bank layer 14 (step S10 in FIG. 10) through, for example, vapor deposition such that the electron transport layer 18 spans over the subpixels.

(7) Forming Electron Injection Layer 19

Figure 8B:
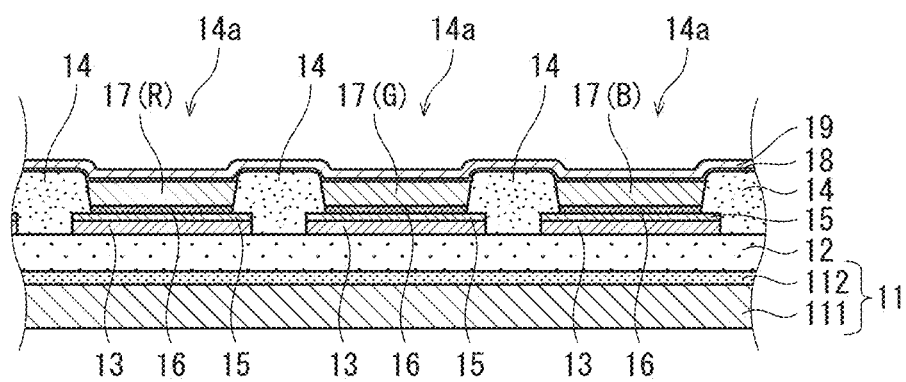

Next, in FIG. 8B, the electron injection layer 19 is formed on the electron transport layer 18 (step S11 in FIG. 10) through, for example, co-deposition such that an organic material which has an electron transport property and a metal dopant span over the subpixels.

(8) Forming Counter Electrode 20

Figure 8C:
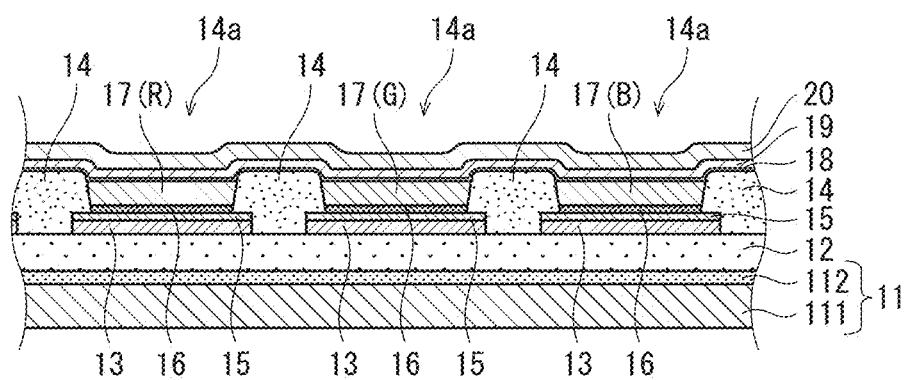

Next, in FIG. 8C, the counter electrode 20 is formed on the electron injection layer 19 (step S12 in FIG. 10) through forming a film of ITO, IZO, silver, aluminum, or the like through sputtering or vacuum vapor deposition.

(9) Forming First Sealing Layer 21

Figure 8D:
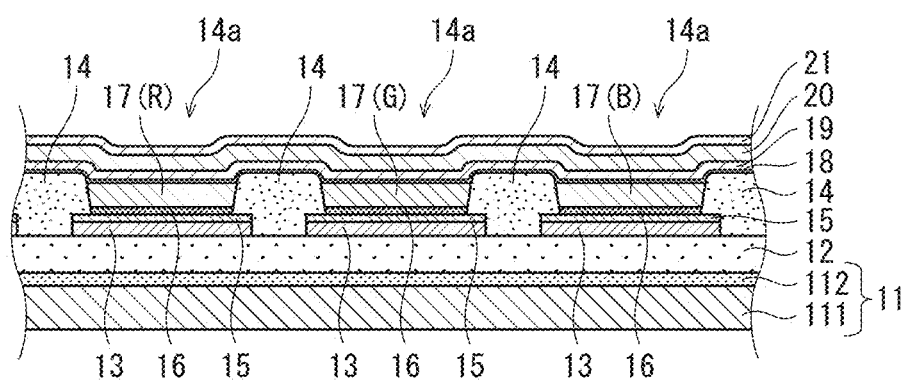

Next, in FIG. 8D, the first sealing layer 21 is formed on the counter electrode 20 (step S13 in FIG. 10) through forming a film of SiON, SiN, or the like through sputtering, chemical vapor deposition (CVD), or the like.

(10) Forming Second Sealing Layer 22

Figure 9A:
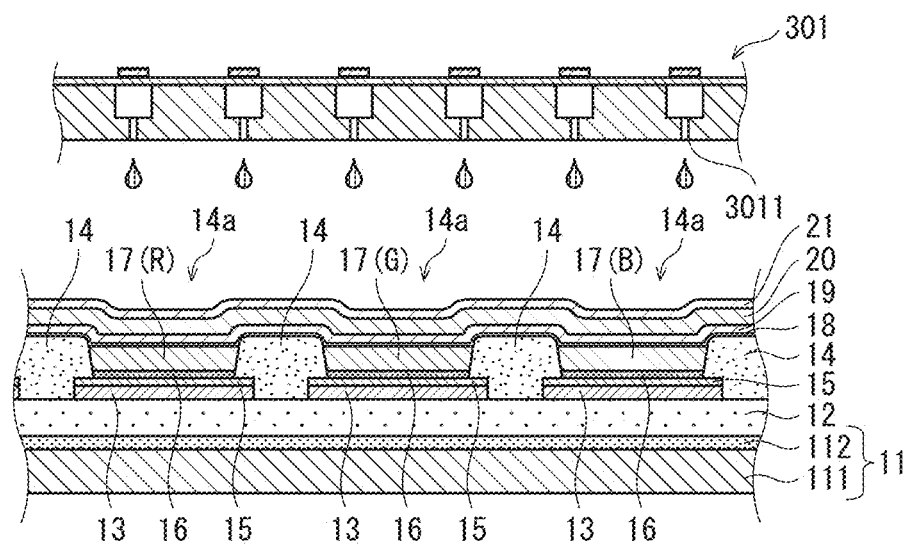
FIG. 9A and FIG. 9B are schematic cross-sectional views of processes of manufacturing the organic EL elements pertaining to at least one embodiment.
Figure 10:
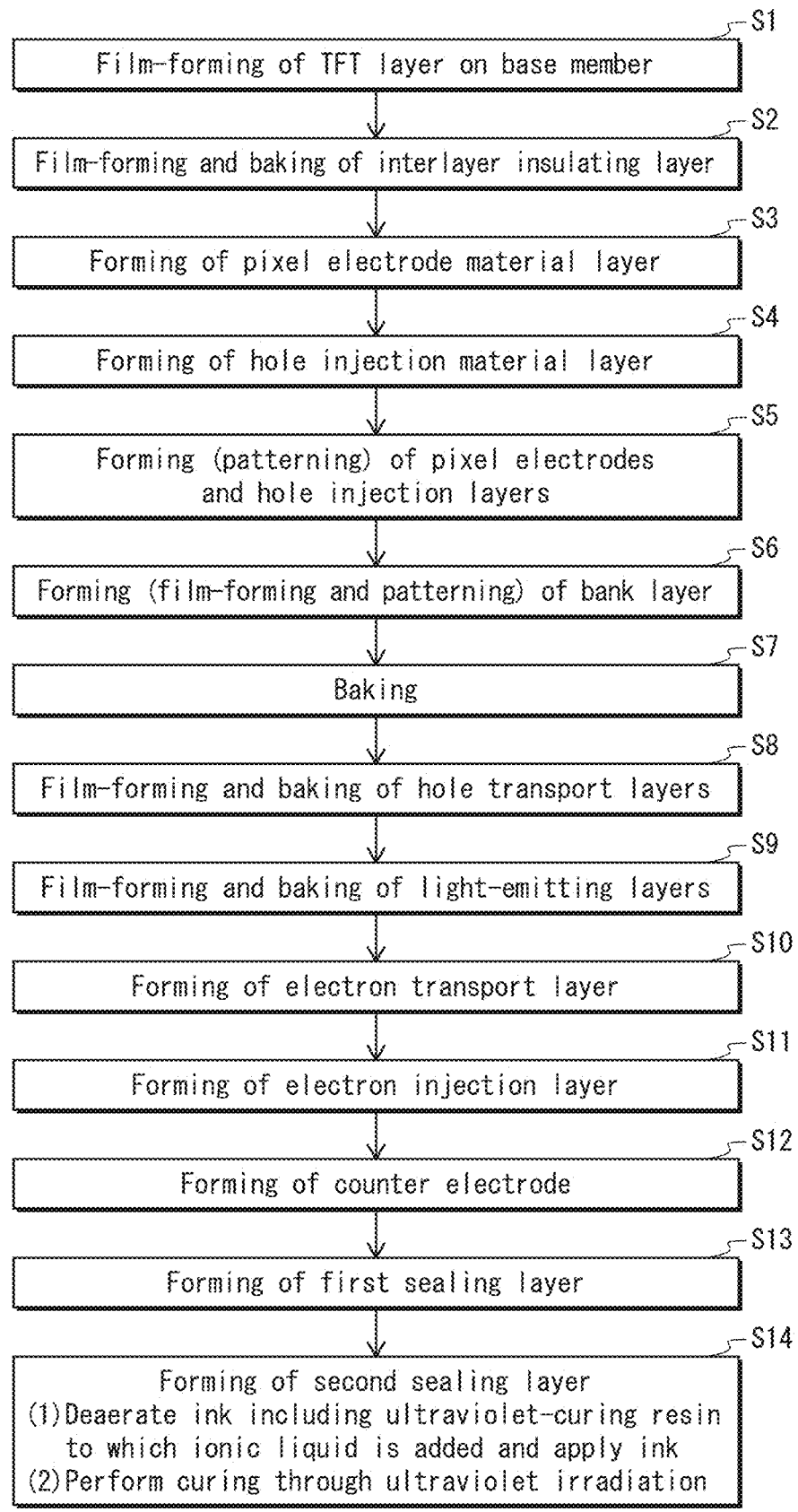
FIG. 10 is a flowchart of processes of manufacturing the organic EL display panel pertaining to at least one embodiment.

Next, in FIG. 9A, the ink which includes the ultraviolet-curing resin and the ionic liquid and whose electrical conductivity is in the range described above is deaerated by using the deaeration device 160 described above. Then, the ink after the deaeration process is ejected from the nozzles 3011 of the inkjet head 301 in the inkjet device 1200 and applied onto the first sealing layer 21. Then, the ink after application is cured through ultraviolet irradiation to form the second sealing layer 22 (step S14 in FIG. 10).

Note that the electrical conductivity of the second sealing layer 22 after curing is the same as the electrical conductivity of the ink before curing, i.e. greater than $1.0 \times 10^{-12}$ S/m and equal to or smaller than 1.0 S/m.

Figure 9B:
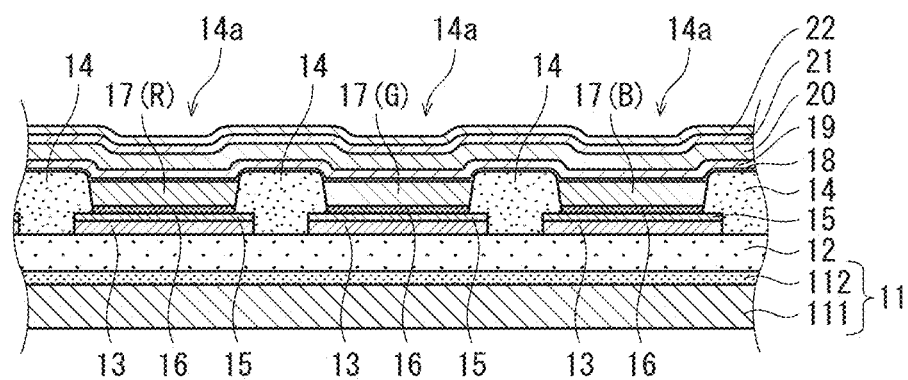

Due to this, in FIG. 9B, the organic EL display panel is completed.

5. Overall Structure of Organic EL Display Device

Figure 11:
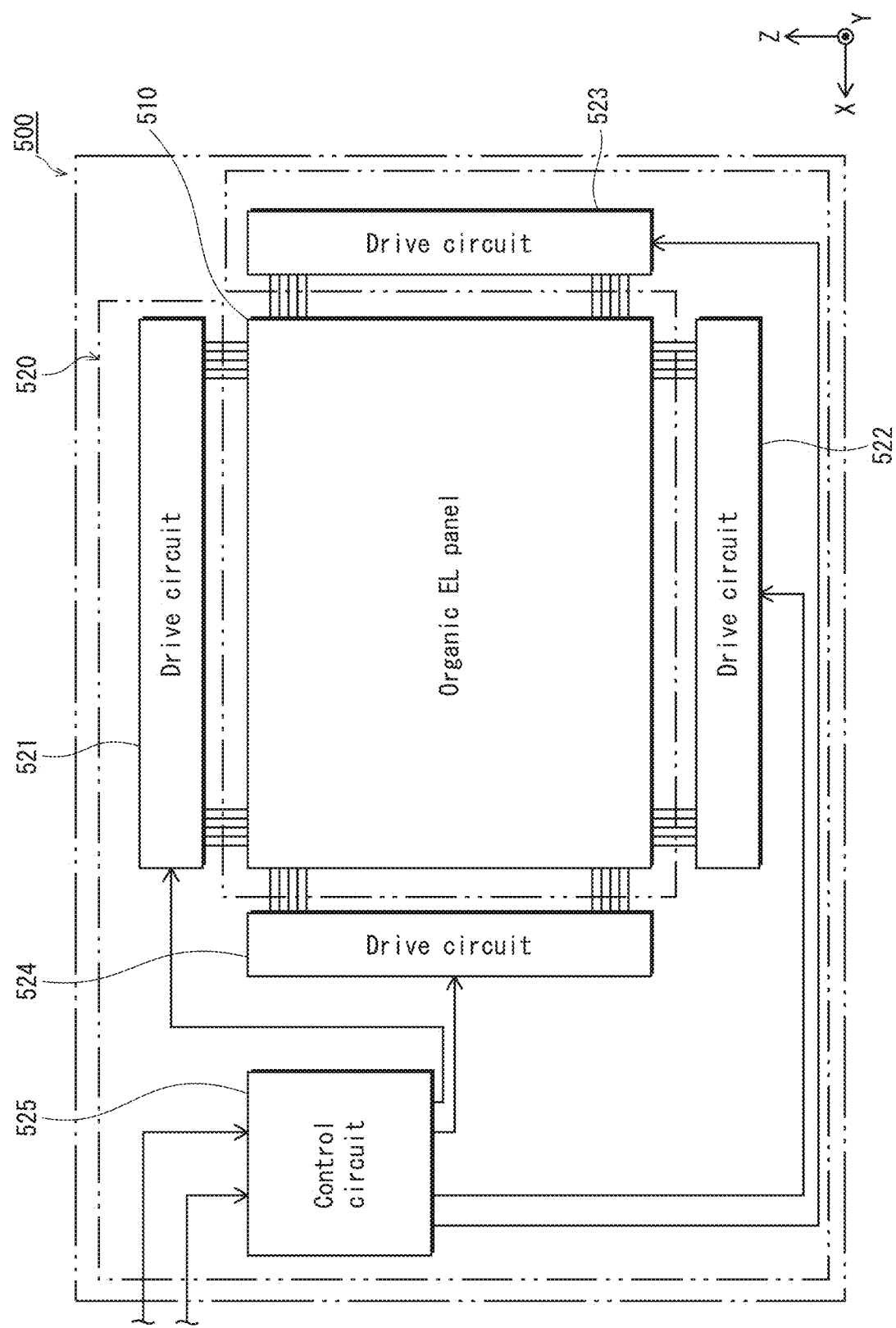
FIG. 11 is a block diagram of a structure of an organic EL display device including the organic EL display panel pertaining to at least one embodiment.

FIG. 11 is a schematic block diagram of a structure of an organic EL display device 500 including an organic EL display panel 510 pertaining to at least one embodiment.

In FIG. 11, the organic EL display device 500 includes an organic EL display panel 510 and a drive control unit 520 connected to the organic EL display panel 510. The drive control unit 520 includes four drive circuits 521, 522, 523, and 524 and a control circuit 525.

Note that arrangement of the drive control unit 520 relative to the organic EL display panel 510 is not limited to this.

<Effects>

As described in the above embodiment, electrical charge of the hollow fiber films in the deaeration device can be removed when the second sealing layer is formed through applying an ink including an organic electrically-insulating material and an ionic liquid is added to the ink to adjust the electrical conductivity to be within a defined range. Consequently, sparks in the hollow fiber films do not occur, and this helps to prevent damaging of the deaeration device. Further, the above embodiment helps to prevent occurrence of unexpected curing reaction of a portion of the ink including an organic electrically-insulating material and consequently causing problems such as appearance of solidified impurities in the sealing layer forming device and clogging of piping of the sealing layer forming device. This helps to improve productivity of organic EL display panels having a high quality.

Other Embodiments

Although an organic EL display panel manufacturing method and a sealing layer forming device pertaining to the present disclosure have been fully described based on at least one embodiment, the present disclosure should not be construed as being limited to the above embodiment, and the following embodiments are possible.

(1) In the above embodiment, an ultraviolet-curing resin to which an ionic liquid that is an electrically-conductive substance is added is used for the ink for the second sealing layer 22, but the present disclosure should not be construed as being limited to this.

For example, a thermosetting resin such as a phenolic resin, an urea resin, a melamine resin, an epoxy resin, polyester (unsaturated polyester) or the like may be used instead of the ultraviolet-curing resin. In top-emission type organic EL display panels, the thermosetting resin for the ink having a high light transmittance is beneficial.

Other organic electrically-insulating materials may be used, but such organic electrically-insulating materials require more time for curing than ultraviolet-curing resins and thermosetting resins. Accordingly, from the perspective of productivity, ultraviolet-curing resins and thermosetting resins are beneficial.

(2) In the above embodiment, an ionic liquid is used for the electrically-conductive substance added to the ultraviolet-curing resin, but the present disclosure should not be construed as being limited to this; any substance that is added to an organic electrically-insulating material to impart an electrical conductivity to the organic electrically-insulating material can be used. For example, electrically-conductive fine particles including a metal such as silver may be added. The electrically-conductive fine particles have a size small enough to pass through the nozzles 3011 of the inkjet device 1200. The electrically-conductive fine particles remain in the second sealing layer 22 after curing of the ultraviolet-curing resin, but this has little effect on the light transmittance as long as the amount of the electrically-conductive fine particles is small.

Note that it is beneficial that the electrical conductivity of the ink be in a range described in the above embodiment even in cases in which an electrically-conductive substance other than an ionic liquid is added.

(3) In the above embodiment, the organic EL display device is a top-emission type of display device and the cathode of the organic EL display device is the counter electrode. However, for example, the anode may be the counter electrode and the cathodes may be the pixel electrodes. Further, for example, the present disclosure may be a bottom-emission type organic EL display device.

(4) Further, in the above embodiment, the electron transport layer 18, the electron injection layer 19, the hole injection layers 15, and the hole transport layers 16 are essential components, but the present disclosure should not be construed as being limited to this. For example, an organic EL element that does not include an electron transport layer 18 and/or the hole injection layer 16 is possible. Further, for example, the organic EL element may include a single hole injection transport layer instead of the hole injection layer 15 and the hole transport layer 16. Further, for example, the organic EL element may include an intermediate layer made of an alkali metal between the light-emitting layer 17 and the electron transport layer 18.

(5) Further, in the above embodiment, description is provided of an example of an inkjet device including an inkjet head of the piezoelectric system that causes the ink to be ejected through changing volumes of the piezoelectric elements, but a thermal inkjet system in which electrothermal converters cause the ink to be ejected may be used. Further, the present disclosure can be used in an application device of a dispenser type that continuously ejects the ink onto the substrate.

(6) Further, the present disclosure should not be construed as being limited to display devices, and may be a panel-type lighting device such as an organic EL lighting device.

Although one or more embodiments pertaining to the present disclosure have been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. A sealing layer forming device comprising:
a tank that stores a sealing solution including an organic electrically-insulating material to which an electrically-conductive substance is added;
a deaeration unit that deaerates the sealing solution in the tank, wherein the deaeration unit causes the sealing solution to pass through a filter including a hollow fiber film made of a fluorine-based resin, thereby deaerating the sealing solution; and
an application unit that applies the sealing solution after deaerating above a plurality of organic EL elements disposed on a substrate.

2. The sealing layer forming device of claim 1, wherein an electrical conductivity of the sealing solution is greater than $1.0 \times 10^{-12}$ S/m and equal to or smaller than 1.0 S/m.

3. The sealing layer forming device of claim 1, wherein the electrically-conductive substance is an ionic liquid.

4. The sealing layer forming device of claim 1, wherein the application unit is an inkjet device.

* * * * *